United States Patent
Suen et al.

(10) Patent No.: US 7,446,676 B2
(45) Date of Patent: Nov. 4, 2008

(54) SELF-SCAN PROGRAMMABLE KEYPAD INTERFACE

(75) Inventors: Ruei-Shiang Suen, San Diego, CA (US); Yan Zhang, Cupertino, CA (US)

(73) Assignee: Broadcom Corporation, Irvine, CA (US)

(*) Notice: Subject to any disclaimer, the term of this patent is extended or adjusted under 35 U.S.C. 154(b) by 210 days.

(21) Appl. No.: 11/418,658

(22) Filed: May 5, 2006

(65) Prior Publication Data
US 2007/0159363 A1 Jul. 12, 2007

Related U.S. Application Data

(63) Continuation-in-part of application No. 11/320,265, filed on Dec. 28, 2005, now abandoned.

(51) Int. Cl.
*H03M 11/00* (2006.01)
(52) U.S. Cl. .................. 341/24; 341/22; 341/26
(58) Field of Classification Search ............... 341/24, 341/26, 22
See application file for complete search history.

(56) References Cited

U.S. PATENT DOCUMENTS

| | | | |
|---|---|---|---|
| 4,460,957 A | 7/1984 | Eggebrecht | |
| 4,502,039 A | 2/1985 | Vercesi | |
| 4,609,908 A | 9/1986 | Amano | |
| 4,644,190 A | 2/1987 | Eberhard et al. | |
| 4,706,068 A | 11/1987 | Eberhard | |
| 4,758,829 A | 7/1988 | Smith | |
| 5,261,079 A | 11/1993 | Celi | |
| 5,274,371 A | 12/1993 | Yang | |
| 5,440,502 A | 8/1995 | Register | |
| 5,457,455 A * | 10/1995 | Lee | 341/24 |
| 5,610,601 A | 3/1997 | Lahti | |
| 5,898,425 A | 4/1999 | Sekine | |
| 5,979,766 A | 11/1999 | Rockstein | |
| 2005/0285449 A1* | 12/2005 | Rush et al. | 307/116 |
| 2006/0049965 A1* | 3/2006 | Laliberte et al. | 341/24 |
| 2006/0068771 A1* | 3/2006 | Lou | 455/419 |

* cited by examiner

*Primary Examiner*—Timothy Edwards, Jr.
(74) *Attorney, Agent, or Firm*—Brake Hughes Bellermann LLP; Paul W. Churilla (57) ABSTRACT

Various embodiments are disclosed relating to a self-scan programmable keypad interface. In an example embodiment, an apparatus is provided that includes a processor, and a keypad interface circuit. The keypad interface circuit may include a detection circuit to detect when one or more keys of a keypad have been pressed, a scan circuit adapted to generate signals for keypad scan to identify one or more keys that have been pressed, a debounce circuit to debounce signals, and a key status register adapted to store a status of one or more keys of the keypad obtained during keypad scan. The processor is adapted to read contents of the key status register to identify one or more pressed keys upon receiving a signal from the keypad interface circuit.

19 Claims, 4 Drawing Sheets

|        | Bit 7 | Bit 6 | Bit 5 | Bit 4 | Bit 3 | Bit 2 | Bit 1 | Bit 0 |
|--------|-------|-------|-------|-------|-------|-------|-------|-------|
| KPSSR7 |       |       |       |       |       |       |       |       |
| KPSSR6 |       |       |       |       |       |       |       |       |
| KPSSR5 |       |       |       |       |       |       |       |       |
| KPSSR4 |       |       |       |       |       |       |       |       |
| KPSSR3 |       |       |       |       |       |       |       |       |
| KPSSR2 |       |       |       |       |       |       |       |       |
| KPSSR1 |       |       |       |       |       |       |       |       |
| KPSSR0 |       |       |       |       |       |       |       |       |

SELF-SCAN PROGRAMMABLE KEYPAD INTERFACE

CROSS-REFERENCE TO RELATED APPLICATIONS

This application is a continuation-in-part of, and claims priority under 35 U.S.C. 120 to, application Ser. No. 11/320,265, filed Dec. 28, 2005, now abandoned and titled "Self-Scan Programmable Keypad Interface", the contents of which are hereby incorporated by reference herein in their entirety.

BACKGROUND

Keypad (or keyboard) interfaces are common for computers, handheld devices, processor based systems, and other computing devices. The keypad interface typically provides an interface between the microprocessor and the keypad. The keypad interface (or significant portions thereof) is typically implemented as a program running on a processor to detect key presses, perform keypad scan, perform debounce functions, and other tasks. Such a software based keypad interface may burden the processor with significant processing overhead or require a separate processor to handle such tasks. For example, a keyboard used with the IBM compatible personal computer (PC) typically uses a programmed processor to handle keyboard functions, which interfaces to the main CPU or processor on the motherboard. Typically, every time a key is pressed, the processor is interrupted, which places a significant burden on the processor and may prevent the processor from operating in a low power state for an extended period of time. If there are multiple keys pressed, most systems cannot process the key presses fast enough, or are error prone or simply unable to identify multiple key presses. Furthermore, many such keypad or keyboard interfaces are limited or lack many programmable features.

SUMMARY

Various embodiments are disclosed relating to keypad interfaces and to self-scan programmable keypad interfaces According to an example embodiment, an apparatus is provided that includes a processor and a hardware keypad interface circuit. The hardware keypad interface circuit may include a detection circuit to detect when one or more keys of a keypad have been pressed, a scan circuit adapted to generate signals for keypad scan to identify one or more keys that have been pressed, a debounce circuit to debounce signals, and a key status register adapted to store a status of one or more keys of the keypad obtained during keypad scan. The processor is adapted to read contents of the key status register to identify one or more pressed keys upon receiving a signal from the hardware keypad interface circuit.

According to another embodiment, a keypad interface circuit is provided that includes an input circuit adapted to provide input signals to a plurality of input lines of a keypad, an output circuit adapted to receive output signals from a plurality of output lines of the keypad. The input circuit and the output circuit are adapted to allow identification of each of multiple keys that are pressed at the same time. The keypad interface circuit also includes a debounce unit adapted to debounce signals, and a scan unit adapted to generate signals to the input circuit for keypad scan to identify one or more keys that have been pressed.

According to another embodiment, a keypad interface is provided, including an input circuit adapted to provide input signals to a plurality of rows or columns of a keypad, an output circuit adapted to receive output signals from a plurality of columns or rows of the keypad, and a key press detector coupled to the output circuit and adapted to detect when one or more keys of the keypad has been pressed. The keypad interface also includes a scan unit adapted to generate signals to the input circuit for keypad scan to identify one or more keys that have been pressed in response to a signal from the key press detector, a first debounce unit coupled to the scan unit and key press detector and adapted to debounce one or more signals output from the key press detector; and a second debounce unit coupled to the output circuit and adapted to debounce keypad status signals output by the output circuit during keypad scan that identify a status of each of a plurality of keys.

DETAILED DESCRIPTION

Figure 1:
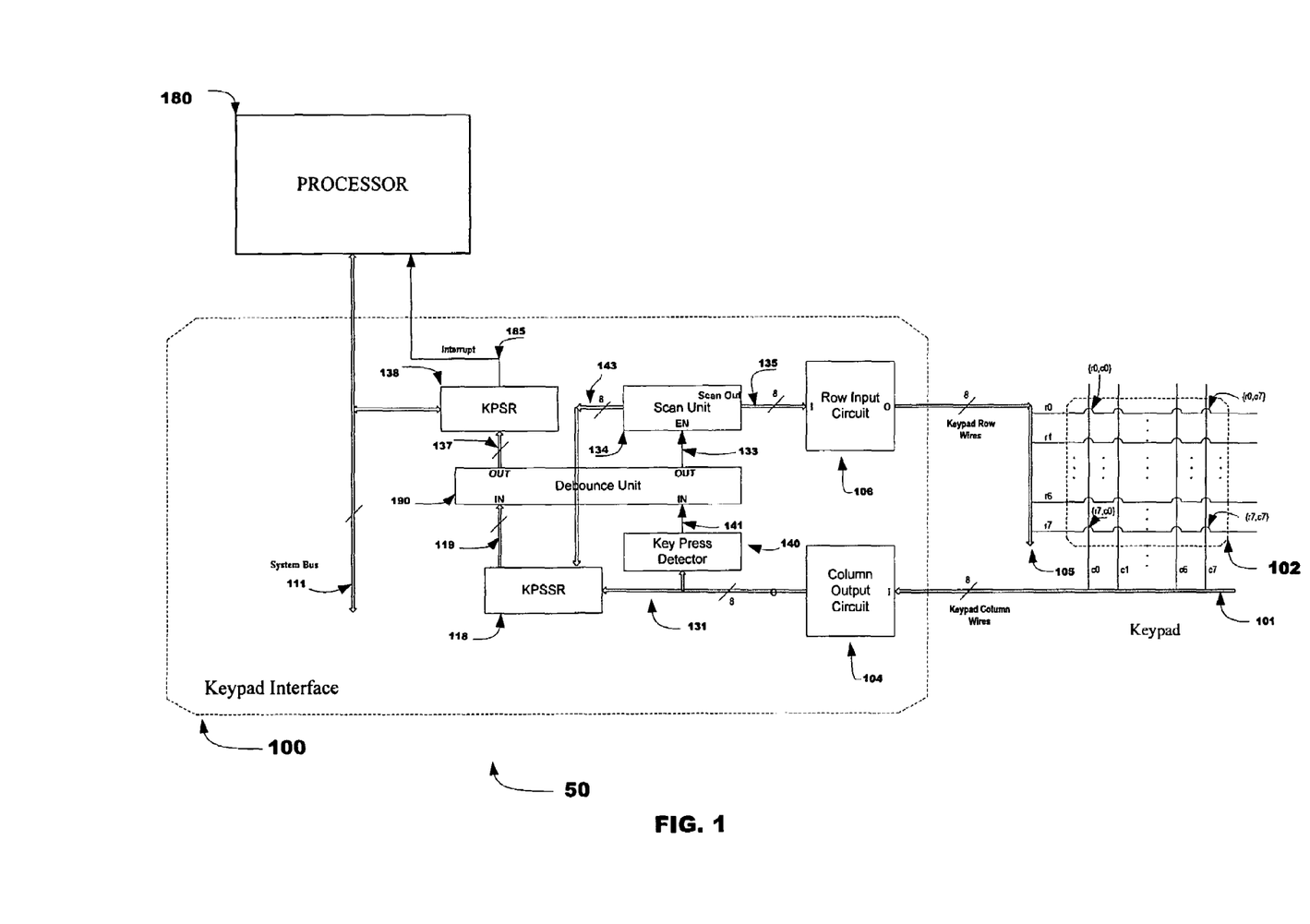
FIG. 1 is a block diagram of a portion of a computing system according to an example embodiment.

FIG. 1 is a block diagram of a portion of a computing system according to an example embodiment. The computing system 50 may include, for example, a keypad 102 to provide key input data, a processor 180 which may execute software or firmware and provide overall control of computing system 50, and a keypad interface 100 that interfaces keypad 102 to processor 180. Processor 180 may be coupled to keypad interface 100 via a system bus 111 and an interrupt line 185, for example. Processor 180 may be any type of processor or controller. Keypad 102 may be any type of keypad, keyboard or other input device. Therefore, the term keypad is used herein to include any type of input device or key input device, such as a keyboard, a keypad, other type of key input device, etc.

Although not shown in FIG. 1, computing system 50 may include other components or blocks, such as memory, other input/output devices or interfaces, and the like. In an example embodiment, processor 180 and keypad interface 100 may be provided as part of an embedded system or a system on a chip (SOC), and/or may be provided on a single integrated circuit or ASIC (application specific integrated circuit), although this is merely an example embodiment and is not required.

Keypad interface 100 may provide a hardware circuit, for example, to perform a variety of tasks associated with interfacing keypad 102 to processor 180, such as detecting that a key or keys have been pressed on keypad 102, performing keypad scan to identify which key(s) have been pressed, performing debounce of key signals, storing an identification of which key has been pressed in a register, sending an interrupt to processor 180 to allow the processor to read the register to determine the key(s) that have been pressed, and other tasks. Tasks associated with keypad interfacing, such as keypad scan, debounce, etc., are often performed in software by a keypad controller or a host processor. For example, in a typical system, a host processor may be interrupted each time a key is pressed, causing the processor to stop other tasks, and perform a software keypad scan and debounce and identify the key presses. Such operation by software is not efficient and may need to debounce a signal for a long time, for example, about 100 ms, thus, for some applications, a software based keypad interface may provide a significant burden or overhead on the host processor and may also increase power consumption by decreasing the amount of time the processor may be in a low power state.

Keypad 102 may include, for example, 64 keys provided as an 8×8 array, although any size or shape keypad may be used. A 64-key keypad is described and illustrated herein merely as an example embodiment, but any number of keys may be used. Each of the 64 keys may be identified as an intersection of a row and a column of the keypad, e.g., a different key at the different intersection of the 8×8 array (8 columns, 8 rows), such as a key at the upper left hand corner of the keypad (r0, c0), a key at the upper right hand corner (r0, c7), a key at the lower left hand corner (r7, c0), a key at the lower right hand corner (r7, c7), as examples. The other keys of keypad 102 similarly are positioned at the intersection of a row and column of the keypad 102.

A group of, for example, 8 row wires 105 are coupled between 8 rows (r0, r1, r2, r3 . . . r7) (or lines) of keypad 102 and keypad interface 100, with one wire of row wires 105 being connected to a respective one of the rows of keypad 102. Likewise, a group of 8column wires 101 are coupled between the keypad columns (c0, c1, c2, c3, . . . c7) (or lines) and keypad interface 100, with one wire of column wires 101 being connected to a respective column of keypad 102. According to an example embodiment, columns and rows may both be considered lines of the keypad. Rows and columns of keypad may be switched, since this may be considered a matter of convention. According to an example embodiment, rows (r0, r1, . . . r7) of keypad 102 may be considered input lines, while columns (co, cl, . . . c7) may be considered output lines, although the input and output lines may be switched of course as this is an example.

In an example embodiment, row wires 105 are output from keypad interface 100 to drive rows (r0, r1, . . . r7) of keypad 102. Column wires 101 are output from keypad columns (c0, c1, . . . c7) to report key presses to keypad interface 100.

Keypad interface 100 may include a row input circuit 106 to provide input signals to rows (r0, r1, . . . r7) via row wires 105. A column output circuit 104 may receive outputs from columns (c0, c1, . . . c7) of keypad 102 via column wires 101. For example, columns (or column lines) of keypad 102 may be active low in a pull-up keypad mode. Thus, in a pull-up keypad mode, each column may be pulled up to a high logic level using a pull-up resistor (active low for columns), and each row (or row line) may be pulled down to a low logic level using a pull-down resistor, as default states. Typically, because a driving strength of transistor is much bigger than pulling resistors, when a key is pressed for pull-up keypad mode, the keypad column on which the key is pressed transitions from high to low logic level due to the connection of the column to the row (row is a low logic level and it is driven by transistor with driving strength). According to an example embodiment, row input circuit 106 and column output circuit 104 may allow identification of each of multiple keys that are pressed at the same time.

Similarly an example of keypad 102 configured in pull-down mode may be if pull-down resistors (e.g., resistors with one end connected to the logic low or ground level) are connected to each of the eight column wires 101 to pull each column to a low logic level as a default state (e.g., active high indicating key pressed for pull-down), and rows being driven to logic high via pull-up resistors. In such case, a key press may cause a column on which the key was pressed to transition from a low to a high logic level in such a pull-down keypad mode, due to a larger drive strength for transistors as compared to pulling resistors. However, what is referred to as a pull-up or pull-down keypad mode may be switched since these names may be a matter of convention.

A key press detector 140 may be coupled to column output circuit 104 via lines 131 to detect when any of keys on keypad 102 have been pressed or actuated. If one or more of the keys on keypad 102 are pressed, then a respective column wire on column wires 101 will become active (e.g., logic low for pull-up keypad mode, or logic high for pull-down keypad mode). Key press detector 140 may be implemented, for example, as an 8-input logic OR gate (for pull-down keypad mode) to output a logic high when one or more of lines 131 are a logic high (otherwise output a logic low indicating no keys pressed). Key press detector 140 may also be implemented, for example, as a logic NAND gate (e.g., for pull-up keypad mode) to output a logic high when one or more of lines 131 are a logic low (otherwise outputs a logic low). These are merely some example embodiments, and key press detector 140 may be implemented using a variety of other circuits.

The output from key press detector 140 may be output via line 141 to a debounce unit 190. Debounce unit 190 may debounce received signals (e.g., providing a debounce filter and/or removing noise, glitches and the like) to output a clean or debounced signal. Debounce unit 190 may receive one or more debounce parameters from processor 180 to program or configure the operation of debounce unit 190, such as a pulse width or minimum pulse width to use as a debounce filter (e.g., signals to be filtered or removed that are shorter than minimum pulse width). According to an example embodiment, if an active level of the received signal on line 141 is longer than the minimum pulse width setting, then debounce unit 190 may pass or output a signal of the same polarity (active signal) indicating that the key press is valid onto line 133). Thus, for example, noise, glitches, etc., having a width that is smaller than the programmable pulse width value, may not be passed by debounce unit 190, according to an example embodiment. The value of the minimum pulse width for debounce unit 190 may be, for example, one millisecond to hundreds of milliseconds for at least some types of keypads, although other numbers for this pulse width may be used.

Thus, according to an example embodiment, in overall operation for key press detection, when a single key is pressed, one of the eight signals of column wires 101 will transition to an active logic state (e.g., from a high to low for pull-up keypad mode). Column output circuit 104 passes this logic level transition via line 131 to key press detector 140. In this example, key press detector 140 may output a single signal (e.g., either high or low) via line 141 to the debounce unit 190 to indicate or notify that a key has been pressed. A received active edge of signal on line 141 may then be debounced by the debounce unit 190 by filtering off the noise or glitches in order to generate a clean signal that is output via line 133 to scan unit 134.

Row input circuit 106 is coupled to scan unit 134 via line 135 and to keypad 102 via the group of 8 row wires 105 to the 8 rows of keypad 102. Row input circuit 106 may drive signals onto keypad rows based on the signal(s) received via line 135 (from scan unit 134). Line 135 may be a multi-signal line (e.g., 8 signals provided via 8 lines).

The debounced active signal output on line 133 from debounce unit 190 (e.g., indicating that a key has been pressed) may trigger the scan unit 134 to generate a scan pattern output onto line 135 in order to identify the one or more keys that have been pressed. The scan pattern output onto line 135 may be received and output by row input circuit 106 to the keypad rows. Any conventional scan patterns may be used to drive keypad rows to allow detection of key presses by detecting logic values on column wires 101 during keypad scan. According to an example embodiment, keypad scanning may be achieved by implementing pull up or pull down resistors on the keypad columns while driving one keypad row at a time with a logic low or logic high respectively, while the other rows are pulled up or pulled down, respectively. The row input circuit 106 may provide the logic signal for each row while the column output circuit 104 may read the resulting logic value on each of the column wires 101. In the case where there are pull up resistors on column signals c0-c7, and the row signals r0-r7 are driven by a logic low value by row input circuit 106 then depressing the key at location r0, c0 results in the signal on column c0 transitioning from a logic high to a logic low. For this example, the logic low drive current output of row input circuit 106 may typically be sufficient enough to pull down the voltage on columns c0-c7 to a logic level low value. In other words the driving strength of logic low level output by row input circuit 106 may typically be stronger (e.g., 50× stronger) than the resistor pull up logic level provided by output circuit 104, according to an example embodiment. The pull up and pull down resistors can also be provided as constant current sources that are sourced to the logic supply voltage or ground respectively. In an example embodiment, the substantially constant current sources may be provided as resistors, but other circuits may be provided, for example, with keypad 102.

Keypad interface 100 may include one or more registers. For example, a keypad scan status register (KPSSR) 118 may be coupled to column output circuit 104 via line 131. KPSSR 118 may receive and store the status (e.g., pressed or not pressed) of keys from keypad 102 via column wires 101 and line 131 during keypad scan. For example, when scan unit 134 outputs a scan pattern on line 135, KPSSR 118 may receive resulting column outputs from keypad 102 indicating key status for the various keys via line 131, or to determine which key(s) in keypad 102 are pressed. A copy of the scan pattern is also output by scan unit 134 to KPSSR 118 via line 143 to identify to KPSSR 118 the scan pattern, e.g., which row is being activated during keypad scan. This may allow KPSSR 118 to store the column outputs (during keypad scan) from lines 101 into specific rows or registers within KPSSR associated with each row of keypad 102 that is activated during keypad scan, for example.

In an example embodiment, a logic 1 for a key status receives via lines 131 and 101 from keypad 102 may indicate that a key is pressed, and a logic 0 may indicate a key not pressed, or vice versa. KPSSR 118 may, for example, store a bit or signal indicating the status of each of the 64 keys of keypad 102. KPSSR 118 may then output these key status signals via line 119 to the debounce unit 190. Debounce unit 190 may debounce the key status signals for each of the keys and output debounced key status signals onto line 137. Debounce unit 190 may, for example, include any number of debounce circuits, such as one debounce circuit (e.g., to debounce each of the 64 key status bits serially in different time slices), 8 debounce circuits to debounce key status bits in groups of 8 in different, partially independent time slices, or 64 debounce circuits to debounce the key status signals for all 64 keys in fully parallel, as examples. Other circuit arrangements or types of circuits may be used for debounce unit 190.

A keypad status register (KPSR) 138 may receive and store the debounced key status signals received via line via line 119 from KPSSR 118. KPSR 138 may therefore contain the valid or debounced key status signals for the keys of keypad 102. These debounced key status signals identify which key(s) have been pressed. According to an example embodiment, an interrupt signal may be generated by KPSR 138 via line 185 to notify processor 180 that one or more keys have been pressed. Upon receipt of an interrupt signal via line 185, processor 180 may then read the contents of KPSR 138 through the system bus 111 to determine which key or keys have been pressed.

According to an example embodiment, the keypad interface 100 may operate independently from processor 180 to detect when a key has been pressed, to perform keypad scan, and to determine and store the identity of any pressed keys. Keypad interface 100 may interrupt processor 180 when the identity of the key that has been pressed has been stored in a register, such as KPSR 138. After the interrupt is initiated (or transmitted), processor 180 may read the key status signals (to determine which keys have been pressed) via the system bus 111 and then may resume its other functions. Therefore, a circuit such as keypad interface 100 (an example embodiment shown in FIG. 1) may allow a significant amount of overhead related to keypad processing (e.g., one or more of key press detection, keypad scan, debounce and identifying which keys have been pressed), typically performed by a programmed processor, to be offloaded to one or more hardware circuit(s), which may result in increased processor efficiency (e.g., due to reduced overhead), and may in some cases allow the processor to spend more time in a low power state.

Figure 3:
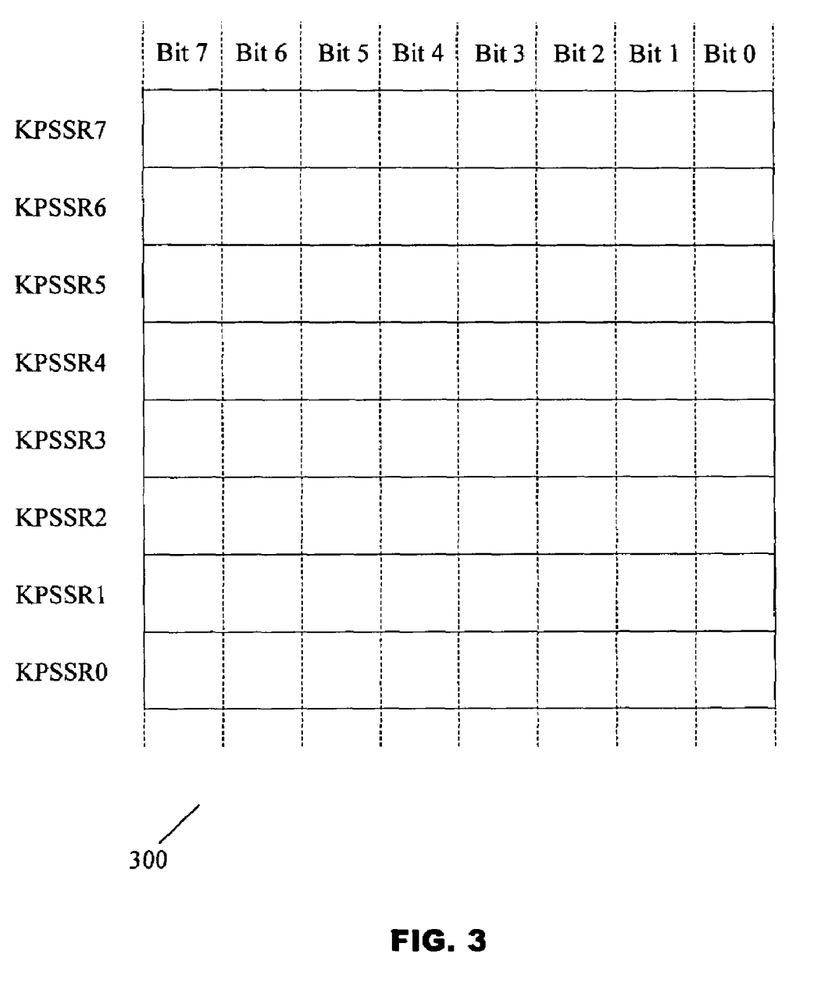
FIG. 3 is a diagram illustrating an example register that may be used for one or more registers in a keypad interface according to an example embodiment.

FIG. 3 is a diagram illustrating an example register that may be used for one or more registers in a keypad interface according to an example embodiment. The example register 300 shown in FIG. 3 provides 64 bits, e.g., for 8×8 keypad array, and to store a key status for each of the 64 keys of keypad 102. Although any size register may be used, e.g., as appropriate for the size of the keypad. One bit in the array shown in FIG. 3 may map to a corresponding key in keypad 102. For example, in some usages of register 300, a logic 1 in register 300 may, for example, indicate that a corresponding key is pressed, and a 0 may indicate that the corresponding key is not pressed.

For example, register 300 (or a register similar thereto) may be used for KPSSR 118, KPSR 138 or for other registers (such as one or more of the registers illustrated in the keypad interface of FIG. 2 below). Also, as a further example, when scan unit 134 generates and outputs the scan pattern to rows of keypad 102, the columns of keypad 102 may output the resulting key status, which may be stored in register 300 (as KPSSR). For example, when scan unit 134 is scanning (activating) row wire r0 (of row wires 105) based on the output scan pattern, the scan pattern output via line 143 may select the register KPSSR0 to store the resulting or status of column wires. Thus, the keypad column outputs resulting from scanning the first row may be stored in KPSSR0 or the first row of KPSSR 118 or register 300 in FIG. 3, where the structure of register 300 may be used for KPSSR 118. For example, when row wire r0 is scanned (based on the scanning pattern), the resulting column output (key status) signals are stored in the first row, KPSSR0. For example, when row r0 is scanned or activated based on the scan pattern, the status of a key at r0, c0, is stored at bit 0 of KPSSR0, the status of a key at r0, c1 is stored at bit 1 of KPSSR0, the status of a key at r0, c2 is stored at bit 2 of KPSSR0, etc. The other rows may be similarly scanned and the column outputs (key status) may be similarly stored in registers KPSSR1, KPSSR2, KPSSR3, etc., until key status for all 64 keys has been read and stored in KPSSR 118 during keypad scan. The register 300 (FIG. 3) illustrates one example embodiment, and many other register formats or structures may be used.

Figure 2:
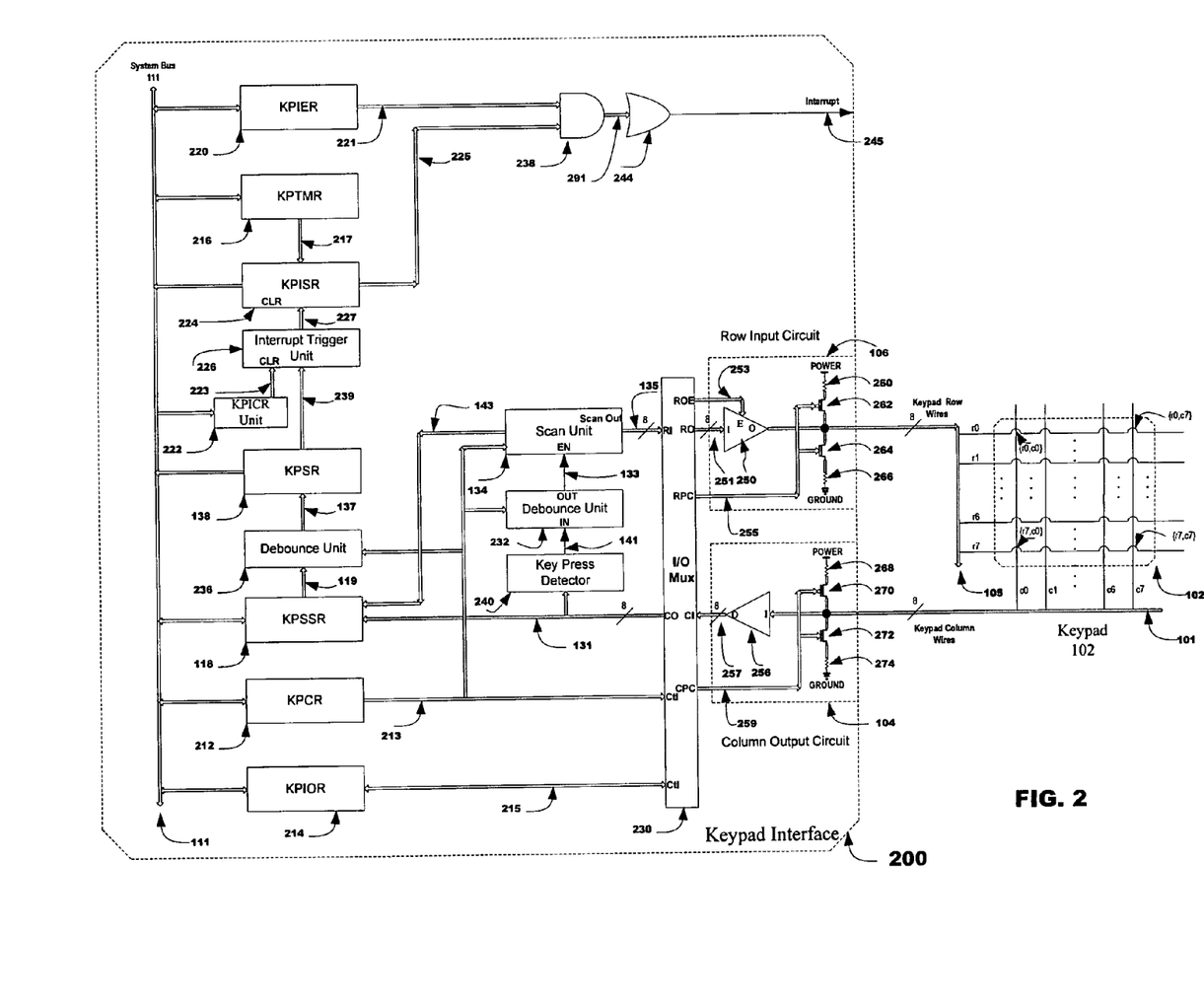
FIG. 2 is a block diagram of a keypad interface according to another example embodiment.

FIG. 2 is a block diagram of a keypad interface according to another example embodiment. In this example embodiment, keypad interface 200 may be coupled to processor 180 (not shown) system bus 111 and interrupt 245 (for example), and coupled to keypad 102, similar to keypad interface 100 in FIG. 1. Keypad interface 200 may include some aspects or features that are the same or similar to the keypad interface 100 (FIG. 1), such as including a row input circuit 106, column output circuit 104, a scan unit 134, at least one debounce unit, a key press detector, and one or more registers, such as KPSSR 118 and KPSR 138. However, the example keypad interface 200 (FIG. 2) may include some additional or different features or further details that will now be described.

Keypad interface 200 may include a row input circuit 106 to provide input signals to keypad 102 via keypad row lines or wires 105, e.g., based on the scan patterns output by scan unit 134. Keypad interface 200 may also include a column output circuit 104 to receive output signals from a plurality of column output lines or wires 101. Column output circuit 104 and row input circuit 106 may allow identification of each of multiple keys that are pressed at the same time, according an example embodiment. A number of different circuits may be used for column output circuit 104 and row input circuit 106 to allow identification of multiple keys pressed at the same time. Keypad interface 200 (including row input circuit 106 and column output circuit 104) may be programmable and may be operable (and configurable to operate) in several different modes (e.g., such as pull-up keypad mode and pull-down keypad mode). An input/output multiplexer (I/O mux) 230 may provide an interface or multiplexer between column output circuit 104 and row input circuit 106 and other circuits or blocks shown in keyboard interface 200.

According to an example embodiment, row input circuit 106 may include a line input circuit for each row of keypad 102 (e.g., each line input circuit may drive a different row of row wires 105). In this example, row input circuit 106 may, therefore, include eight line input circuits (one line input circuit connected to each row wire). According to an example embodiment, each line input circuit may be substantially the same as the other line input circuits within row input circuit 106. Therefore, only one line input circuit is shown in row input circuit 106, to simplify the illustration of keypad interface 200 shown in FIG. 2, even though wires 251, 153, 255 and 105 (and others) are shown with a bus signal in the Figures. According to an example embodiment, a line input circuit (within circuit 106) may include a tri-state buffer 250, and a combination of transistors and resistors, such as resistors 260 and 266, and transistors 262 and 264. However, this circuit 106 is merely an example embodiment, and other circuits may be used as well.

Scan unit 134 may output a scan pattern via lines 135 to row input (RI) port of I/O mux 230. These scan patterns may be output by I/O mux 230 via row output (RO) port onto line 253 and then to buffer 250 via line 251. In an example embodiment, I/O mux 230 may, for example, allow the input signals received via the RI port to be converted to different voltages (if necessary for buffer 250) or to different logic levels, before being output onto RO port. Another example is the IO mux allowing for swapping the column and row signals, for example, swap the input RI to output CI, input CO to output RO with relative signals swapping accordingly. Buffer 250 may, for example, transfer or pass the logic value received via line 251 from RO port to the output of buffer 250 whenever the enable signal received via line 253 is active. The buffer enable signal (E) is received via line 253 from row output enable (ROE) port of I/O mux 230. When line 253 is active the internal driving transistors of buffer 250 may be active, pulling or driving the corresponding keypad row to a logic level (e.g., high or low) corresponding to an input on line 251. Whenever line 253 is not active for example, buffer 250 stops driving its output and goes into a tri-state condition (e.g., floating output). When the output of buffer 250 is in tri-state mode (e.g., floating output), this allows the row wire (one of row wires 105) coupled to the output of buffer 250 to remain at its default state, either pulled up or pulled down, based on pulling resistors 260 and 266.

In addition, one line input circuit of row input circuit 106 may include two pulling resistors, such as a pull-up resistor 260 coupled to a power source and a pull-down resistor 266 coupled to ground, for example. A PMOS (P-channel Metal Oxide Semiconductor) transistor 262 is coupled between pull-up resistor 260 and the row wire. An NMOS (N-channel Metal Oxide Semiconductor) transistor 264 is coupled between the row wire and pull-down resistor 266.

According to the configuration of input signals on lines 213 and 215, I/O mux 230 may output a row control signal (either a logic high or low) from RPC port onto line 255. This row control signal on line 255 is input to gates of transistors 262 and 264. For example, a high on the row control signal on line 255 may typically turn on NMOS transistor 264 and turn off PMOS transistor 262, pulling down the row line to a logic low (e.g., to ground via resistor 266) as a default state. On the other hand, a low on the row control signal on line 255 may typically turn on PMOS transistor 262 and turn off NMOS transistor 264, pulling the row line to a logic high (to power via resistor 260). Typically, both transistors 262 and 264 will not be on at the same time, thereby avoiding a conflicting row wire condition. Regardless whether the row wire is pulled up (logic high) or pulled down (logic low), the row wire (or row line) may typically remain in this default pulling state until buffer 250 drives the row wire to a different state (or until the row control signal on line 255 is changed) because the drive strength of output buffer 250 may be much bigger than the strength of pulling resistors 260 or 266. As indicated above, this is because the drive strength of a transistor is typically much stronger than the strength of pulling resistors, according to an example embodiment.

Similarly, according to an example embodiment, column output circuit 104 may include a line output circuit for each column of keypad 102 or for each column wire (101). Therefore, each line output circuit of column output circuit 104 may receive a signal from a different column of keypad 102. In this example, column output circuit 104 may, therefore, include eight line output circuits (one line output circuit connected to each column or column wire). According to an example embodiment, each line output circuit may be substantially the same as the other line output circuits within column output circuit 104. Therefore, only one line output circuit is shown in column output circuit 104, to simplify the illustration of keypad interface 200 shown in FIG. 2. According to an example embodiment, a line output circuit (within circuit 104) may include a buffer 256, and a combination of transistors and pulling resistors, such as resistors 268 and 274, and transistors 270 and 274. However, this circuit 104 is merely an example embodiment, and other circuits may be used.

Referring to the example line output circuit within column output circuit 104 (FIG. 2), a buffer 256 receives a logic value or signal on a column wire (one of column wires 101) and outputs or transfers this signal onto line 257, which is input to the column input (CI) port of I/O mux 230. Thus, buffer 256 may receive and output a logic level for each of the 8 column wires onto line 257 (e.g., line 257 may include 8 lines or signals). I/O mux 230 may typically output or transfer this signal(s) via the column output (CO) port onto line 131 of the I/O mux 230. The line output circuit (within circuit 104, FIG. 2) may also include the same column wire signal levels, which may be used to read the keypad status. Thus, line 131 may also include the 8 signals output via the 8 column wires 101.

Column output circuit 104 may include a PMOS transistor 270 coupled between a pull-up resistor 268 and the column wire, and also an NMOS transistor 272 coupled between the column wire and a pull-down resistor 274. A column control signal is output from CPC port of I/O mux 230 onto line 259 and input to the gates of transistors 270 and 272. A logic high on the column control signal via line 259 will typically turn on NMOS transistor 272 (and turn off PMOS transistor 270), thereby pulling down the row wire to a logic low as a default state. A logic low on the column control signal via line 259 will typically turn on PMOS transistor 270 (and turn off transistor 272), thereby pulling up the column wire to a logic high as a default state. The column wire will remain in its default state (either pulled up or down, depending on the column control signal), but may be changed to a different logic state based on the output on the corresponding column from keypad 102. In other words, a signal output from the column wire from keypad 102 may override the default state provided by the pull-up or pull-down resistor (e.g., when a key is pressed) because the driving strength of output buffer 256 is typically much larger than the sum of all pulling resistors (including pulling resistors coupled to rows and columns of keypad 102) in row input circuit and column output circuit. This may allow other circuits, e.g., within keypad interface 200, to detect when a key has been pressed.

According to an example embodiment, a keypad input/output register (KPIOR) 214 may be provided to allow the processor 180 to directly read and write the keypad interface port, such as the keypad row wires 105 and column wires 101, e.g., via line 215, allowing for a general purpose I/O function.

Keypad interface 200 may also include a Keypad Control Register (KPCR) 212, which may be read from and written to by processor 180 via system bus 111, for example. KPCR 212 may be used by processor 180 or other controller to program one or more features or aspects of keypad interface 200. For example, processor 180 (FIG. 1) may write one or more control bits to KPCR 212 to (as examples): identify or change the size of keypad 102, to change the debounce parameters used by one or more debounce units (e.g., minimum pulse width), to change the scan pattern used by scan unit 134, and also to program the row input circuit 106 and column output circuit 104 to operate in either a pull-up keypad mode or a pull-down keypad mode. Control information, e.g., indicating either pull-up or pull-down keypad mode, may be output, for example, by KPCR 212 via line 213 into a control (Ctl) port of I/O mux 230. This control information received by I/O mux 230 may, for example, control the signals (or logic levels) output onto row control signal via line 255 and column control signal via line 259, e.g., based on whether pull-up keypad mode or pull-down keypad mode has been selected. For example, in a pull-up keypad mode, the row control signal output from RPC port to line 255 may be a logic high to cause the default state for each row to be low, and the column control signal output from CPC port onto line 259 may be a logic low to cause the default state for each column to be a high. On the other hand, in a pull-down keypad mode, the row control signal and column control signal may be a logic low and high, respectively.

According to an example embodiment, a common hexadecimal notation may be used to describe row and column logic states for keypad 102 or wires. For example, the notation of 0×FF for the eight columns or rows may indicate eight logic high states. Likewise a 0×00 for the eight columns or rows may indicate eight logic low states.

After power is on without any keys pressed, the keypad 102 may go into an idle state. In an idle state, according to an example embodiment, buffer 250 may turn on based on an active signal on line 253, to drive the 8 row wires 105 with the logic value received on line 251. In this case, for a pull-up keypad mode at idle state (without keys pressed), the received signals on line 251 and the signals output onto row wires 105 may be 0×00 (all 8 row wires are logic low). Also, at idle state, the 8 column wires 101 may be at a logic state of 0×FF (all column wires 101 are logic high).

According to an example embodiment, the driving strength of the transistors in buffer 250 may typically be stronger than the driving strength of transistors 262, 264, 270 and 272, and buffer 250 should be strong enough to drive the desired logic level through shorted wires caused by a key (or multiple keys) being pressed, according to an example embodiment. The keypad interface may be able to detect or handle a situation where multiple keys or even all keys are pressed, in one example embodiment. For example, the strength of buffer 250 is strong enough, in an example embodiment, to drive the logic level of a row wire whose keys are all pressed to logic low in a reasonable amount of time. This reasonable period of time may, for example, be constrained by keypad scan speed. For example, buffer 250 should be strong enough to drive the logic level of a row wire whose keys are all pressed to a logic low before a keypad scan turns to (or activates) the next row wire.

For this example, in pull-up keypad mode, when no keys are pressed the 0×FF state on the column wires is passed through as a 0×FF from I/O mux 230 onto line 131 while row wires 105 are being driven to logic low as 0×00 by buffer 250. When any single key is pressed for pull-up keypad mode, the row wire and column wire for the key are shorted, and row input circuit 106 drives the corresponding column wire to low (e.g., column wire pulled low by a low on a connected row wire). As a result of the column of the pressed key being driven to a logic low, the corresponding one of the eight lines of line 131 will go to logic low. For example if c0 is represented as the LSB (Least Significant Bit) in the Hex notation and one or more keys is pressed in c0, then the value of line 131 may be represented as 0×FE. Similarly pressing one or more keys in c7 may be represented as a value of 0×7F for line 131.

Keypad interface 200 may include a key press detector 240 to detect when any key has been pressed. In an idle state (for pull-up keypad mode), the 8 wires on column wires 101 and, thus, the 8 wires on line 131 may be 0×FF (all highs). When one of the keys is pressed, the column wire connected to the pressed key is driven or pulled to a logic low by the connected row. As a result of the change in signals on line 131 (from key press), the key press detector 240 may detect the pressed key, and thereby causing scan unit 134 to generate a scan pattern to identify which key(s) have been pressed. Key press detector 240 may be, for example, an 8-input NAND gate for pull-up keypad mode, an 8-input OR gate for pull-down keypad mode, or other circuit. For example, in pull up keypad mode with no keys pressed, the state of 131 is 0×FF. If all the keypad rows 105 are driven low by buffer 250 then, for any one key pressed, one signal of line 131 becomes logic low and generates an active condition on line 141. Receiving an active edge of signal 141 may then start the debounce unit 232, which may filter off any noise or glitches that occur during the key press transition. An active output from debounce unit 232 via line 133 may cause the scan unit 134 to generate scan patterns.

Debounce unit 232 may remove any noise or glitches or the like from its input signal on line 141 before generating a valid output signal on line 133. A signal received from system bus 111 via line 213 to keypad control register (KPCR) 212 may allow processor 180 or other device to provide debounce parameters, such as a minimum pulse width allowed to pass through the debounce unit 232. The time value of the debounce minimum pulse width may be programmed into KPCR 212 by the processor through system bus 111. For example, when the active level of line 141 is longer than the minimum pulse width setting defined by KPCR 212, the debounce unit 232 may indicate to the scan unit 134 via line 133 that a valid key press has occurred (valid keypad active signal). Noise or glitches whose width is smaller than the programmable value for minimum pulse width may not pass the debounce filter 232 and therefore may not generate an active signal onto line 133. Therefore, an active signal output onto line 133 may be considered as a "valid key press active signal."

The scan unit 134 may generate the scan pattern onto line 135 in the presence of a valid key press active signal on line 133. The scan pattern may be output onto line 135 during the scan period, and then passed through the I/O mux 230 and the row input circuit 106 onto the row wires 105. An example of a scan pattern may be buffer 250 in a tri-state condition and configured with pull up resistor 260 for 7 of the 8 rows and driving for example the $8^{th}$ row as logic 0 using the transistor (s) within buffer 250. With one key pressed, and pull-up resistors present on the keypad column wires 101, this scan condition will allow identification of which key(s) has been pressed. For example assume keypad interface 200 is configured in pull up keypad mode (as described previously) and that the key at location r0, c0 is pressed for a duration that meets or exceeds the debounce requirement. Since the initial condition of row input circuit 106 may be to put all rows to logic low state, this key press will result in an active condition on signal line 133. The scan unit may then output on line 135, 8 consecutive patterns, each pattern which may enable 7 keypad row wires 105 with a tri-state with pull up resistor 260 activated, and one keypad row wire 105 pulled to logic low. If the pattern sequence is for example 0×FE, 0×FD, 0×FB, 0×F7, 0×EF, 0×DF, 0×BF, 0×7F then a logic low will be present on c0 but only when row r0 is pulled low and r1-r7 are tri state (i.e. state 0×FE on the keypad rows 105). When column c0 goes to logic low at the time when r0 is driven low, keypad interface 200 determines that key r0, c0 was pressed. Another example scan pattern (when keypad interface 200 is configured for pull-up keypad mode) may exclude the need for pull up resistor 260 while the row wires are driven with a tri-state condition since pull up resistor 268 is present on the column wires 101.

According to an example embodiment, the row input circuit 106 and/or the column output circuit 104 may allow for identification of each of multiple keys that are pressed at the same time. This may be achieved during the output of the scan pattern since the strength of the buffers 250 and 260 are strong enough to pull or drive (overcome or override) the pulling resistors 260, 266, 268 and 274 to the desired logic state (e.g., strength of buffers 250 and 260 may be stronger than strength of transistors 262, 264, 270 and 272 because, for example, transistors 262, 264, 270 and 272 are connected to pulling resistors 260, 266, 268 and 274 in serial respectively). For example if all of the keys on column c0 are being pressed at the same time and the keypad interface 200 is scanning row wire r0 (e.g., pulling r0 to a logic low), all 8 pull-up resistors 260 on the keypad row wires 105 and/or any pull-up resistors 268 on the column wires c0 will be connected and pulled to the logic low present on r0. According to an example embodiment, one (or more) transistor of buffer 250 may be driving as many as 8 pull up resistors low. If the driving strength of buffer 250's transistors is greater than the sum of 8 resistive drives, then, according to an example embodiment, all 8 keys can be detected as being pressed once the logic level of column wire c0 falls from logic high to logic low before the scan switches to drive the next row wire. An extreme case may be if all the keys of the keypad are pressed. Buffer 250's drive transistor may then require enough drive to pull all pull up resistors (15 resistors for this example) to a logic low state. In this extreme case, the keypad scan speed may be slower than that of the prior example because the falling time for buffer 250 to drive row wires r0 from logic high to logic low may be longer than that in the prior example, e.g., if buffer 250 is not especially strong. However, the circuits illustrated for row input circuit 106 and column output circuit 104 are examples, and the disclosure is not limited thereto. Many other circuits may be used to allow identification of multiple key presses at the same time.

Keypad interface 200 may allow processor 180 to configure the scan mode of operation. For example the processor can load KPCR (keypad control register) 212 with keypad control information via system bus 111. The I/O mux 230 may be able to change the scan pattern output on line 251 by receiving control information, for example, via line 213 connected to the control (Ctl) port.

According to an example embodiment, in the pull-down keypad configuration, the scan pattern output on line 135 may be the same as for pull-up keypad mode, but I/O mux 230 may revise the logic levels. Thus the scan pattern output onto line 251 in pull-down keypad mode may be, for example, a rolling pattern such as 0×01, 0×02, 0×04, 0×08, 0×10, 0×20, 0×40, 0×80. This pattern may enable 7 keypad row wires 105 with both a tri-state and a pull-down resistor 266 activated (transistor 264 on), and one keypad row wire 105 driven to logic high. This scan pattern may then cause the column wires 101 to achieve a logic high state when a key is pressed (otherwise column wires will be logic low). This may require the use of an "OR" type logic for key press detector 240. Like pull-up mode, this pull-down keypad mode may also allow the recognition of multiple key presses because the internal transistor(s) in buffer 250, for example, that may create the logic high has enough drive or power to pull up all pull down resistors present on keypad row wires 105 and column wires 101.

The duration of the scan pattern may be sufficient to allow, for example, all eight scan patterns to be enabled during any minimum key press condition. For example, the key scan pattern may complete its entire pattern within the time that a valid key press signal is detected and the signal on line 133 is activated. Similarly the duration of each scan pattern may be, for example, long enough to allow the buffer transistor in buffer 250 to drive hard enough to compensate for all pulling resistors that may be present on the row wires 105 and column wires 101. The size of the scan pattern may be directly proportional to the size of the keypad. For example, for a 4×5 keypad a scan pattern 0×FE, 0×FD, 0×FB, 0×F7 may be used.

The keypad interface 200 may include a keypad scan status register (KPSSR) 118 to store a status of one or more keys of the keypad 102. The data of the key press states may be loaded into KPSSR 118 via line 131, for example, during the scan mode. KPSSR 118 may also receive a signal on line 143 from the scan unit 134 that may represent which one row wires is scanning so that which register bits of KPSSR to store keys status. (e.g., when scanning row wires, the signal on line 143 addresses which 8 register bits, for example, KPSSR0 in FIG.

3 for row wires r0, may store current status of column wire 131 into KPSSR). In an example embodiment, whenever the column information on line 131 may not be debounced, KPSSR 118 may store status of line 131 only at every end point of row wire scanning. For example, when KPSSR 118 detects a 0x01 on line 143, KPSSR 118 may store the status of column input line 131 into KPSSR0 (See FIG. 3); when 0x02 is on line 143, status of 131 may store into KPSSR1; when is 0x04 on line 143, status of 131 may store into KPSSR2 . . . . Since processor 180 can directly read KPSSR 118 through system bus 111, it may obtain the status of all keys in keypad 102, including which key(s) have been pressed. For example, during scan of row wire r0, if the value stored in KPSSR0 is 0xFE (pull up keypad), the processor 180 may detect that the key {r0, c0} is pressed because bit 0 of KPSSR0 is zero (e.g. column c0 is active in pull up keypad) and KPSSR0 stored the status when scanning row wire r0 and the intersection of row wire r0 and column wire c0 is the key {r0, c0}.

Keypad interface 200 may include a second debounce unit 236 coupled via line 119 to KPSSR 118. Debounce unit 236 may debounce key status signals stored in KPSSR 118, and then output the debounced key status signals via line 137 for storage in KPSR 138. Debounce unit 236 may include, for example, one or more debounce circuits to debounce all 64 bits of KPSSR 118. For example, if KPSSR 118 includes 64 bits, debounce unit may include 64 separate debounce circuits to debounce all 64 key status signals in parallel, 8 debounce circuits to debounce a row or column of key status signals at a time, or a single circuit to debounce each key status or bit serially, or partially in parallel, or fully in parallel.

KPSSR 118 and KPSR 138 may each be provided as a 64-bit register, and may be the same or similar to the structure of register 300 illustrated in FIG. 3, for example. Other register structures may be used. KPSR 138 may store one or more, or even all, of the key's status after being debounced by debounce circuit 236. In this manner, the clear or debounced status of each key may be read by processor 180 via system bus 111, so that processor 180 may know when keys are pressed, how many keys are pressed, which keys are pressed (or not pressed), when a pressed key is released, etc. KPSSR 118 may also be accessed by processor 180 via system bus 111. Meanwhile, the processor 180 can read the key status from KPSSR 118 but the status in KPSSR may not necessarily be debounced, which means the processor 180 itself may include code or firmware to perform debounce and thus may use additional processor power for such debouncing. In addition, providing a way for software (via microprocessor 180) to read the raw (undebounced) key status from KPSSR 118 may assist in system debug, but such an embodiment may use processor resources to perform such a debounce, in an example embodiment.

According to an example embodiment, the use of two separate debounce units 232 and 236 may allow for debounce unit 236 to be disabled until scan unit 134 has received a valid key press state via line 133 from debounce unit 232. This may allow for a decrease in power consumption while debounce unit 236 is disabled. For example, only debounce unit 232 is needed to be active during idle mode (e.g., when no key press yet detected), and power to debounce unit 236 may be disabled until scan has started.

The debounced key status of each key stored in KPSR 138 is output via line 239 to interrupt trigger unit 226. The key status signals may then be output by interrupt trigger unit 226 via line 227 to keypad interrupt status register (KPISR) 224. KPISR 224 may store the interrupt status for each of the 64 keys, e.g., indicating which keys have been pressed and requesting an interrupt for each key pressed. KPISR 224 may have the same bit matrix structure as register KPSSR 118 where every register bit is assigned to a corresponding key. A system bus input to KPISR 224 may allow the processor 180 to read the key state that caused the interrupt and may allow for disabling the interrupt at anytime after the interrupt has been serviced.

KPIER (Key Pad Interrupt Enable Register) 220 may allow processor 180 to identify which keys on the keypad may generate an interrupt by masking any unwanted key interrupts (or non-existent keys) contained on KPISR output line 225. If for example KPIER 220 has the same bit structure as KPISR 224 then a logic AND operation 238 between lines 225 and 221 may cause a keypad interrupt signal on line 239 for only those bits set or enabled in KPIER 220. An OR logic at OR gate 244 may then, for example, gather all the keys'interrupt signals to generate one interrupt output on line 245 that may be used by the processor to service a keypad interrupt.

KPTMR (Key Pad Trigger Mode Register) 216 may contain the definition of the key state (or trigger mode) that may cause an interrupt on line 225. This may be, for example, a rising or falling edge, or both edges of a key press, or when a key is pressed, or when a key is released or when a key is either pressed or released. The key press states that may cause an interrupt may be defined by a programmed setting defined by the processor 180 and loaded into KPTMR 216 through bus 111, according to an example embodiment. The trigger mode may be programmed for all keys, or on a per-key basis (e.g., if KPTMR is a 64-bit register similar to register 300), etc. The programmed trigger mode information may be provided from KPTMR 216 to KPISR 224 via line(s) 217.

A change in key state may cause a processor interrupt notifying the processor of the change. KPSR 238 may have an output on line 239 that represents all key states after debounce and is fed into an interrupt trigger unit 226 where changes in key state (or key status) on 239 may generate an interrupt via setting bits in KPISR 224.

Processor 180 may select which keys may generate interrupts (e.g., for selected keys, or for keypad smaller than 8x8) by writing is to those key locations in keypad interrupt enable register (KPIER) 220. Key interrupt status signals output by KPISR 224 via line 225 may be masked at interrupt mask circuit 238 based on interrupt enable signals received via line 221 from KPIER 220. For example, KPIER 220 may be an AND gate, to logically "AND" the key interrupt signals received via line 225 with corresponding interrupt enable signals received via line 221. A high may be output by any of the 64 logical AND gates 238 to indicate an interrupt generated by an interrupt enabled key (e.g., interrupt enabled key has been pressed). This group of signals is output on line 291 to OR gate 244. An interrupt may typically be generated on line 245 if any of the interrupt enabled keys have been pressed, according to an example embodiment.

After an interrupt has been generated on line 245 and received (e.g., and processed) by processor 180, the processor 180 may clear the interrupt status bit(s) stored in KPISR 224 by keypad interrupt clear unit (KPICR) 222 via system bus 111, in response to a signal from processor 180 that the interrupt has been received or handled.

Other register may be provided, such as KPCR (Keypad Control Register) 212 and KPIOR (Keypad IO Register) 214. KPCR 212 is an example register that may be accessed by a processor 180 via bus 111 and may have each bit represent different control information. For example a bit in KPCR 212 may enable the keypad interface 200 into a pull-up or pull-down mode or configure the size of the keypad used. KPIOR 214 may be used to allow the processor to directly read and write the keypad interface port, such as the keypad row wires 105 and column wires 101 allowing for a general purpose I/O function. A further example for using KPIOR 214 as a general purpose I/O function may be when the size of the keypad 102 is smaller than the maximum size keypad that can be supported by the keypad interface 200. If, for example, the keypad interface 200 can accommodate an 8×8 keypad but a 4×5 keypad is used, the additional 4 row signals and 3 column signals from the keypad interface 200 may be routed externally as general purpose I/O to be used by the processor 180. KPIOR 214 may also allow processor 180 to directly access row wires 105 and column wires 101. This may be useful, for example, for debug, where processor 180 may be able to execute functions of keypad interface (100, 200).

Figure 4:
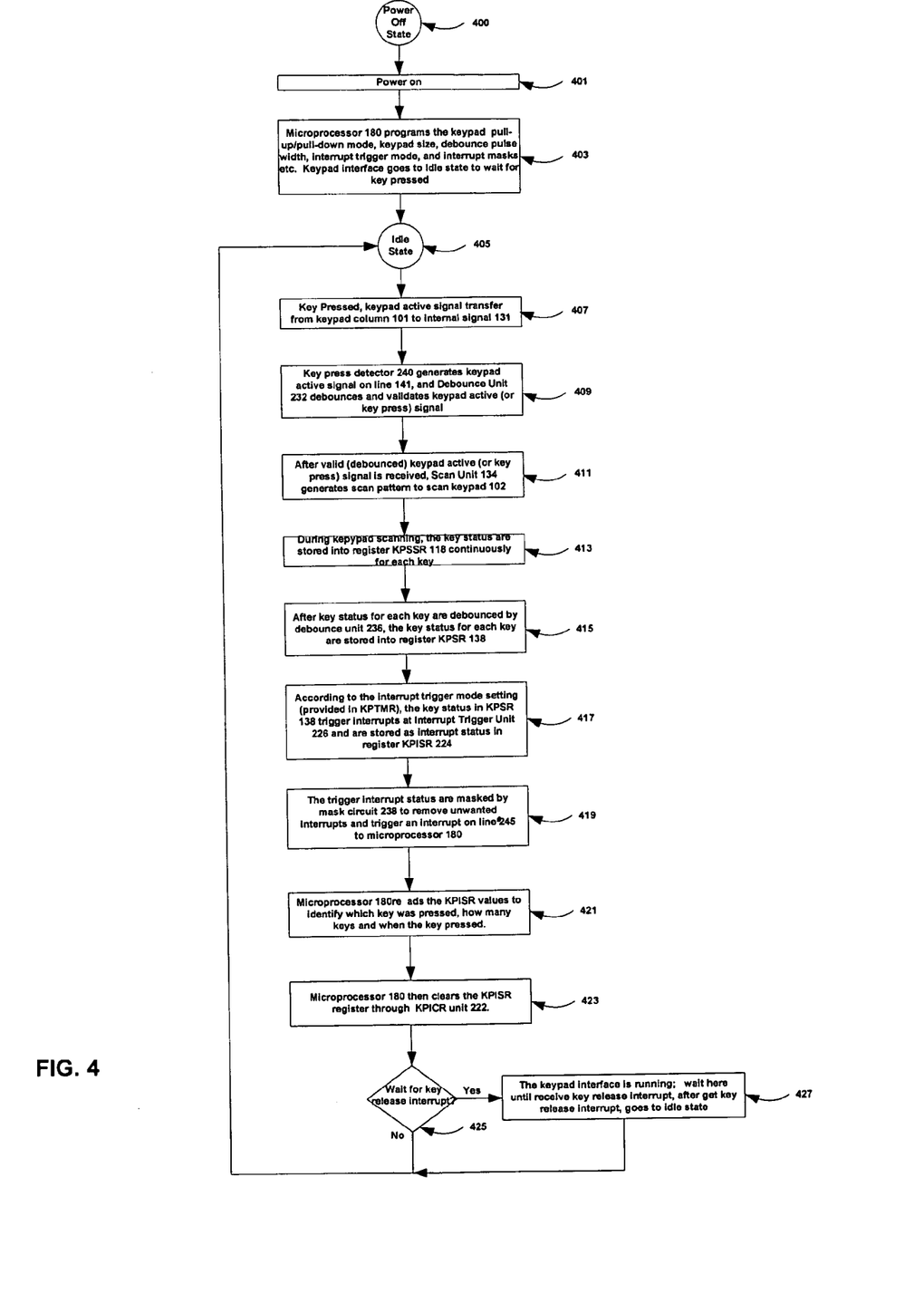
FIG. 4 is a flow chart illustrating an operation of a keypad interface according to an example embodiment.

FIG. 4 is a flow chart illustrating an operation of a keypad interfacing according to an example embodiment. At 400, power is off. At 401, power is turned on. At 403, microprocessor 180 programs the keypad 102 into pull-up or pull-down mode, the keypad size, the debounce pulse width, the interrupt trigger mode (e.g., rising edge, falling edge, both), and interrupt masks (e.g., to remove potentially unwanted or spurious interrupts), etc. Keypad interface goes to idle state, 405, to wait for key pressed.

At 407, a key is pressed, and a keypad active signal transfer from keypad column 101 to internal signal line 131. At 409, key press detector 240 generates a keypad active signal on line 141, and debounce unit 232 debounces and validates keypad active (or key press) signal. At 411, after a valid (debounced) keypad active (or key press) signal is received, scan unit 134 generates a scan pattern to scan keypad 102 via line 135. At 413, during keypad scanning, the key statuses are stored into register KPSSR 118 continuously for ev for each key is debounced by debounce unit 236, the key status for each key is stored into register KPSR 138. At 417, according to the interrupt trigger mode setting (provided in KPTMR), the key statuses in KPSR 138 generate or trigger interrupts through interrupt trigger unit 226. Interrupt status for each key is stored in register KPISR 224. At 419, the interrupt satuses are masked by mask circuit 238 to remove unwanted interrupts and trigger an interrupt on line 245 to microprocessor 180. At 421, microprocessor 180 reads the KPISR values to identify which key was pressed, how many keys and when the keys were pressed, etc. At 423, microprocessor 180 clears the KPISR register through KPICR unit 222. At 425, the keypad interface waits for a key release interrupt, indicating that the key has been released, then the keypad interface goes to idle state, 427. In an example embodiment, during flow from 407 to 427, all of the circuitry of keypad interface 200 may be operating.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus comprising:
    a processor; and
    a hardware keypad interface circuit including:
        a detection circuit to detect when one or more keys of a keypad have been pressed;
        a scan circuit adapted to generate signals for keypad scan to identify one or more keys that have been pressed;
        a debounce circuit to debounce signals;
        a key status register adapted to store a status of one or more keys of the keypad obtained during keypad scan;
        a keypad interrupt enable register adapted to indicate which keys on the keypad may generate an interrupt; and
        a keypad interrupt trigger mode register adapted to indicate an edge or state of a key signal that will generate an interrupt,
    wherein the processor is adapted to read a contents of the key status register to identify one or more pressed keys upon receiving a signal from the hardware keypad interface circuit.

2. The apparatus of claim 1 wherein the processor and the hardware keypad interface circuit are provided on a same integrated circuit.

3. The apparatus of claim 1 wherein the hardware keypad interface circuit further includes:
    an input circuit adapted to provide input signals to the keypad; and
    an output circuit adapted to receive outputs from the keypad, the input circuit and/or output circuit being configurable to operate in one of multiple keypad modes.

4. The apparatus of claim 1 wherein the hardware keypad interface circuit further includes:
    an input circuit adapted to provide input signals to a plurality of input lines of the keypad; and
    an output circuit adapted to receive output signals from a plurality of output lines of the keypad, wherein the input circuit and the output circuit are adapted to allow identification of each of multiple keys that are pressed at the same time.

5. A keypad interface circuit comprising:
    an input circuit adapted to provide input signals to a plurality of input lines of a keypad, wherein the input circuit comprises a line input circuit for each of a plurality of input lines of the keypad, each line input circuit comprising:
        a pulling resistor adapted to pull the keypad input line to a default state; and
        a buffer with an enable signal, the buffer being coupled to the scan unit and adapted to output a keypad line input signal based on a signal received from the scan unit when the enable signal is active, the buffer being adapted to override the default state of the keypad line;
    an output circuit adapted to receive output signals from a plurality of output lines of the keypad, wherein the input circuit and the output circuit are adapted to allow identification of each of multiple keys that are pressed at the same time;
    a debounce unit adapted to debounce signals; and
    a scan unit adapted to generate signals to the input circuit for keypad scan to identify one or more keys that have been pressed.

6. The keypad interface circuit of claim 5 wherein the input circuit is adapted to provide input signals to a plurality of rows or columns of the keypad, and wherein the output circuit is adapted to receive output signals from a plurality of columns or rows respectively, of the keypad.

7. The keypad interface circuit of claim 5 wherein the input circuit and the output circuit are configurable to operate in either a pull-up keypad mode or a pull-down keypad mode.

8. The keypad interface circuit of claim 5 and further comprising a keypad control register adapted to allow a configuration of the input circuit and/or the output circuit to operate in either a pull-up keypad mode or a pull-down keypad mode.

9. The keypad interface circuit of claim 5 wherein the pulling resistor comprises at least one of: a pull-up resistor and a pull-down resistor.

10. The keypad circuit of claim 5 wherein each of the line input circuits further comprises one or more transistors adapted, based on a control signal, to select the default state for the keypad input line to be either a first default state or a second default state.

11. The keypad interface circuit of claim 10 wherein the one or more transistors comprise:
a first transistor adapted, based on a control signal, to select the default state for the keypad input line to be a first level; and
a second transistor adapted, based on a control signal, to select the default state for the keypad input line to be a second level.

12. The keypad interface circuit of claim 5 wherein the output circuit comprises a line output circuit for each of a plurality of output lines of the keypad, each line output circuit comprising:
a pulling resistor adapted to pull the keypad output line to a default state; and
a buffer having an input coupled to the output line, the state of the output line adapted to override the default state for the output line based upon whether or not a key coupled to the output line has been pressed.

13. The keypad interface circuit of claim 12 wherein each of the line output circuits further comprises one or more transistors adapted, based on a control signal, to select the default state for the keypad output line to be either a first default state or a second default state.

14. The keypad interface circuit of claim 5 and further comprising a keypad status register coupled to the output circuit and adapted to store a respective status of one or more keys of the keypad.

15. The keypad interface circuit of claim 5 and further comprising a key press detector coupled to the output circuit and adapted to detect when one or more keys of the keypad has been pressed.

16. The keypad interface circuit of claim 5 wherein the debounce unit comprises:
a first debounce unit coupled to the scan unit and adapted to debounce one or more signals indicating that a key has been pressed; and
a second debounce unit coupled to the output circuit and adapted to debounce keypad status signals output by the output circuit during keypad scan that identify a respective status of each of a plurality of keys.

17. The keypad interface of claim 5 and further comprising a keypad interrupt status register adapted to indicate which keys are pressed and generate an interrupt.

18. The keypad interface of claim 5 and further comprises at least one of:
a keypad interrupt enable register adapted to indicate which keys on the keypad may generate an interrupt; and
a keypad interrupt trigger mode register adapted to indicate an edge or state of a key signal that will generate an interrupt.

19. A keypad interface comprising:
an input circuit adapted to provide input signals to a plurality of rows or columns of a keypad, wherein the input circuit comprises a line input circuit for each of a plurality of input lines of the keypad, each line input circuit comprising:
a pulling resistor adapted to pull the keypad input line to a default state; and
a buffer with an enable signal, the buffer being coupled to the scan unit and adapted to output a keypad line input signal based on a signal received from the scan unit when the enable signal is active, the buffer being adapted to override the default state of the keypad line;
an output circuit adapted to receive output signals from a plurality of columns or rows of the keypad, wherein the output circuit comprises a line output circuit for each of the plurality of output lines of the keypad, each line output circuit comprising:
a pulling resistor adapted to pull the keypad output line to a default state; and
a buffer having an input coupled to the output line, the state of the output line adapted to override the default state for the output line based upon whether or not a key coupled to the output line has been pressed;
a key press detector coupled to the output circuit and adapted to detect when one or more keys of the keypad has been pressed;
a scan unit adapted to generate signals to the input circuit for keypad scan to identify one or more keys that have been pressed in response to a signal from the key press detector;
a first debounce unit coupled to the scan unit and key press detector and adapted to debounce one or more signals output from the key press detector; and
a second debounce unit coupled to the output circuit and adapted to debounce keypad status signals output by the output circuit during keypad scan that identify a respective status of each of a plurality of keys.

* * * * *